United States Patent [19]
Moon

[11] Patent Number: 6,113,689
[45] Date of Patent: Sep. 5, 2000

[54] METHOD OF CRYSTALLIZING AMORPHOUS SILICON LAYER

[75] Inventor: Dae-Gyu Moon, Kyongki-do, Rep. of Korea

[73] Assignee: LG Electronics Inc., Seoul, Rep. of Korea

[21] Appl. No.: 09/048,321

[22] Filed: Mar. 26, 1998

[30] Foreign Application Priority Data

May 12, 1997 [KR] Rep. of Korea ................. 97-18244

[51] Int. Cl.[7] ................................. C30B 19/08
[52] U.S. Cl. .................. 117/43; 117/46; 117/903; 117/933
[58] Field of Search ................. 117/933, 46, 43, 117/904

[56] References Cited

U.S. PATENT DOCUMENTS

| | | |
|---|---|---|
| 4,234,358 | 11/1980 | Cellar et al. .................. 117/933 |
| 4,371,421 | 2/1983 | Fan et al. .................. 117/933 |
| 4,473,433 | 9/1984 | Bosch et al. .................. 117/933 |
| 4,737,233 | 4/1988 | Kamgar et al. .................. 117/933 |
| 4,888,302 | 12/1989 | Ramesh .................. 117/933 |
| 5,145,808 | 9/1992 | Sameshima et al. .................. 117/933 |
| 5,160,575 | 11/1992 | Chen .................. 117/933 |
| 5,322,589 | 6/1994 | Matsuoka et al. .................. 117/933 |

*Primary Examiner*—Robert Kunemund
*Attorney, Agent, or Firm*—Morgan, Lewis & Bockius LLP

[57] ABSTRACT

A method of crystallizing an amorphous silicon layer on a substrate includes the steps of irradiating the amorphous silicon layer by a laser beam positioned over the amorphous silicon layer and having a predetermined repeat rate, while simultaneously partially heating the laser-irradiated part of the amorphous silicon layer upwardly with an RTP, thus crystallizing the amorphous silicon by a laser without damaging the glass substrate by a high temperature.

19 Claims, 6 Drawing Sheets

METHOD OF CRYSTALLIZING AMORPHOUS SILICON LAYER

This application claims the benefit of Korean patent application No. 97-18244, filed May 12, 1997 which is hereby incorporated by reference.

BACKGROUND OF THE INVENTION

1. Field of the Invention

The present invention relates to a method of crystallizing an amorphous silicon layer on a substrate. More particularly, the present invention relates to a method of crystallizing an amorphous silicon layer without damaging the glass substrate by a high temperature process.

2. Discussion of the Related Art

Thin film transistors manufactured using amorphous silicon are generally fabricated at lower temperatures than transistors using single-crystal or polycrystalline silicon, but they present a disadvantage in that their charge carriers have a low mobility in channel regions. Thin film transistors using polysilicon typically have non-uniform characteristics, because the ability of their charge carriers depends on a degree of crystallization, and in general there is fluctuation in such degree of crystallization over a substrate. This is generally not true for thin film transistors using single-crystal silicon. Polycrystalline thin film transistors are also more affected by the grain boundary effects, where the carriers in channels have to pass through crystal grain boundaries, because polysilicon contains more crystalline grains than single-crystal silicon. In a thin film transistor having a channel region that is formed by crystallizing amorphous silicon, each grain of crystal should be formed as large as possible to reduce the number of crystalline grains and enhance the carrier mobility. The size of crystalline grains formed through amorphous silicon crystallization by a laser beam depends on the energy density of the laser beam, temperature of the substrate, and the rate of the crystallization. It is important, therefore, to properly adjust these parameters to regulate the production and growth of crystals from amorphous silicon.

Amorphous silicon is crystallized by melting using a laser, and allowing the silicon to solidify and cool. This produces crystalline grains that act as seed crystals that gradually grow into large crystalline grain. Each of crystalline grains has an arbitrary but fixed crystal orientation under normal growth conditions. Therefore, they become polycrystalline when a plurality of crystalline grains are concurrently grown.

FIGS. 1A–1G are diagrams that illustrate a process of amorphous silicon crystallization according to conventional art, which is typically performed on the amorphous silicon on a substrate by an overlap scanning method using a laser at room temperature of between 300° C. and 400° C. Since lateral crystal growth is achieved in the 1 to 2 μm range at these temperatures, the laser beam should scan the substrate in 1 μm steps.

Referring to FIG. 1A, a silicon oxide ($SiO_2$) layer 101, functioning as a buffer layer, is formed on a glass substrate 100, and an amorphous silicon layer 10, to be crystallized, is formed on the silicon oxide layer 101. A laser beam 50, approximately 1 mm wide, is positioned over the amorphous silicon layer 10. The laser equipment is set to generate a laser beam that has a appropriate energy density and a repeat rate for the process, and that is focused on the amorphous silicon layer 10. The melted portion of the amorphous silicon layer 10 irradiated by the laser beam is referred to as "molten region 10a."

Referring to FIG. 1B, the next step requires moving the emitting position of the laser beam 50 about 1 μm from the previous position. Before the laser beam is emitted toward the substrate from the shifted position, the molten region 10a cools and solidifies, producing a crystal structure transition. During the cooling and solidification processes, different parts of the molten region 10a produce seed crystals that will grow concurrently in different orientations. Because the laser beam is approximately 1 mm wide, the amorphous silicon can crystallize to form a polycrystalline region 10p of about 1 mm wide.

Referring to FIG. 1C, the laser beam 50 is projected onto the substrate from the shifted position. The laser-irradiated portion of the substrate, the silicon layer 10 which includes a large part of the polycrystalline region 10p and an amorphous silicon region of about 1 μm wide, becomes a new molten region 10a at the shifted position.

Referring to FIG. 1D, the next step requires moving the emitting position of the laser beam 50 about 1 μm from the previous position. As previously described with reference to FIG. 1B, before the laser beam is emitted toward the substrate from the newly set emitting position, a crystal structure transition occurs in the amorphous silicon layer's molten region 10a that is formed in the step of FIG. 1C, and accordingly the molten region 10a is cooled and solidified. During the cooling and solidification processes, the boundary of the remaining polycrystalline region 10p that is located on the lateral wall of the molten region 10a acts as a new seed crystal to give a lateral growth in the molten region 10a, forming a single-crystal region 10m. Single-crystal growth occurs for about 1 to 2 μm in width when the substrate is heated to between 300 and 400° C., as described above. Single-crystal lateral growth on this side of the molten region 10a continues until the other part of the molten region 10a produces several seed crystals and grows into small crystals. This part of the molten region 10a will be referred to as "quasi-polycrystalline region 10s".

Referring to FIG. 1E, the laser beam 50 is projected onto the substrate. The laser-irradiated portion of the silicon layer 10, which includes a portion of single-crystal region 10m, quasi-polycrystalline region 10s, and an amorphous silicon region of about 1 μm wide becomes a new (third) molten region 10a.

Referring to FIG. 1F, the next step requires moving the emitting position of the laser beam 50 about 1 μm from the previous position. As previously described with reference to FIG. 1B, before the laser beam is emitted toward the substrate from the new emitting position, a crystal structure transition occurs in the newly created amorphous silicon layer's molten region 10a, the molten region 10a cools and solidifies. During the cooling and solidification process, the boundary of the single-crystal region 10m that is located on the lateral wall of the molten region 10a acts as a new seed crystal to give a lateral growth in the molten region 10a, expanding the single-crystal region 10m. In addition, the quasi-polycrystalline region 10s is formed in the other part of the molten region 10a.

The amorphous silicon layer 10 is melted, cooled and solidified, in a repeated manner, and the entire substrate is eventually irradiated by a laser as shown in FIG. 1G. Part of the first polycrystalline region 10p acts as a seed crystal that has grown to the single-crystal region 10m. The quasi-polycrystalline region 10s remains at the other edge of the single-crystal region 10m. As a result, a single crystal layer can be grown from the amorphous silicon on a glass substrate.

As described above, a conventional crystallization process is carried out at room temperature or between 300° C. and 400° C., and a lateral growth of crystals might be in the 1 to 2 μm range in width at most for each step of laser irradiation. On a large-sized substrate, this crystallization rate is too slow and decreases the production yield. FIG. 2 illustrates the time required for amorphous silicon crystallization. The time for a large-sized glass substrate is given by the following equation:

$$t = \frac{(\text{scanning length of glass substrate})}{(\text{lateral growth length}) \times (\text{laser repeat rate})} \times \begin{array}{l}\text{the number of scan paths}\\ \text{of scanning operations}\end{array}$$

With a laser beam length of 150 mm, a laser repeat rate of 300 Hz, a substrate's width of 300 mm, and 2 required scanning operations, the time for conventional single-crystallization of a glass substrate 300×350 mm² can be calculated by using the above equation as follows:

$$t = \frac{(350 \text{ mm})}{(1 \text{ μm} \times 10^{-3} \text{ mm/μm}) \times (300/\text{sec})} \times 2 \quad \text{(Equation 1)}$$
$$= 2333 \text{ sec} = \sim 40 \text{ minutes}$$

As a result, about 40 minutes is required to crystallize amorphous silicon formed on a glass substrate of 300×350 mm². This means that 1.5 substrate sheets per hour can be crystallized. This low processing rate is mainly due to a short lateral growth length because the crystallization is performed at room temperature or at a temperature between 300° C. and 400° C. in the conventional art. In order to reduce the time for crystallization, the lateral growth length must be increased.

When the lateral growth length is increased to about 5 μm, the time for processing a substrate will dramatically decrease as follows:

$$t = \frac{(350 \text{ mm})}{(5 \text{ μm} \times 10^{-3} \text{ mm/μm}) \times (300/\text{sec})} \times 2 \quad \text{(Equation 2)}$$
$$= 466 \text{ sec} = 7.7 \text{ min}$$

A higher temperature of the substrate is desirable to increase the lateral growth length; for example, the lateral growth length increases to 5 μm when the substrate is heated to approximately 700° C. to 800° C. However, such high temperature process is not suitable for a glass substrate because the glass substrate is warped and/or softened by the high temperatures.

SUMMARY OF THE INVENTION

Accordingly, the present invention is directed to a method of crystallizing an amorphous silicon layer that substantially obviates one or more of the problems described above due to the limitations and disadvantages of related art.

An object of the present invention is to provide a method of crystallizing an amorphous silicon layer on a substrate at a faster rate in order to accelerate the production process of devices that includes polycrystalline or single-crystal thin film transistors.

Additional features and advantages of the present invention will be set forth in the description which follows, and will be apparent from the description, or may be learned by practice of the invention. The objectives and other advantages of the invention will be realized and attained by the structure and process particularly pointed out in the written description as well as in the appended claims.

To achieve these and other advantages and in accordance with the purpose of the present invention, as embodied and broadly described, in accordance with a first aspect of the present invention, there is provided a method of crystallizing an amorphous silicon layer on a substance including the steps of positioning a laser beam over the amorphous silicon layer on the substrate, irradiating a portion of the amorphous silicon layer by the laser beam, and heating the portion of the amorphous silicon layer from below the substrate while the portion is irradiated by the laser.

In a second aspect of the present invention there is provided a method of crystallizing an amorphous silicon layer on a substrate using a pulse laser, the method including the steps of irradiating a first predetermined area of the amorphous silicon layer on the substrate with a first laser beam pulse, during the step of irradiating the first predetermined area, thermally and locally annealing a portion of the amorphous silicon layer that is adjacent the first predetermined area of the amorphous silicon layer, irradiating a second predetermined area of the amorphous silicon layer with a second laser pulse, the second predetermined area overlapping with the first predetermined area, and during the step of irradiating the second predetermined area, thermally and locally annealing a portion of the amorphous silicon layer that is adjacent the second predetermined area of the amorphous silicon layer.

In a third aspect of the present invention, there is provided a method of crystallizing an amorphous silicon layer on a substrate using a laser, the method including the steps of forming a seed crystal region including a plurality of single crystal grains at one end of the amorphous silicon layer on the substrate, irradiating a first predetermined area of the amorphous silicon layer on the substrate with a first laser beam, the first predetermined area overlapping with the seed crystal region, during the step of irradiating the first predetermined area, thermally and locally annealing the first predetermined area of the amorphous silicon layer, a portion of the amorphous silicon layer in the first predetermined area that is adjacent the seed crystal region being grown to a substantially single-crystal layer, irradiating a second predetermined area of the amorphous silicon layer with a second laser, the second predetermined area overlapping with the first predetermined area, a non-overlapping region of the first predetermined area being substantially coincident with the substantially single-crystal layer, and during the step of irradiating the second predetermined area, thermally and locally annealing the second predetermined area of the amorphous silicon layer, a portion of the amorphous silicon layer in the second predetermined area that is adjacent the substantially single crystal layer being transformed to single-crystal, expanding the substantially single-crystal layer to a larger substantially single-crystal layer.

In a fourth aspect of the present invention, there is provided a method of crystallizing an amorphous silicon layer on a substrate using a laser, the method including the steps of positioning an emitting position of the laser over the amorphous silicon layer on the substrate, irradiating a first laser beam from the emitting portion, irradiating a first predetermined area of the amorphous silicon layer on the substrate with a first laser beam pulse, during the step of irradiating the first predetermined area, thermally and locally annealing a portion of the amorphous silicon layer that is adjacent the first predetermined area of the amorphous silicon layer, irradiating a second predetermined area of the amorphous silicon layer with a second laser pulse, the second predetermined area overlapping with the first predetermined area, and during the step of irradiating the second predetermined area, thermally and locally annealing a portion of the amorphous silicon layer that is adjacent the second predetermined area of the amorphous silicon layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute part of this specification, illustrate embodiments of the invention and together with the description serve to explain the principles of the invention.

In the drawings.

DETAILED DESCRIPTION OF PREFERRED EMBODIMENTS

Reference will now be made in detail to the preferred embodiments of the present invention, examples of which are illustrated in the accompanying drawings.

Figure 1A:
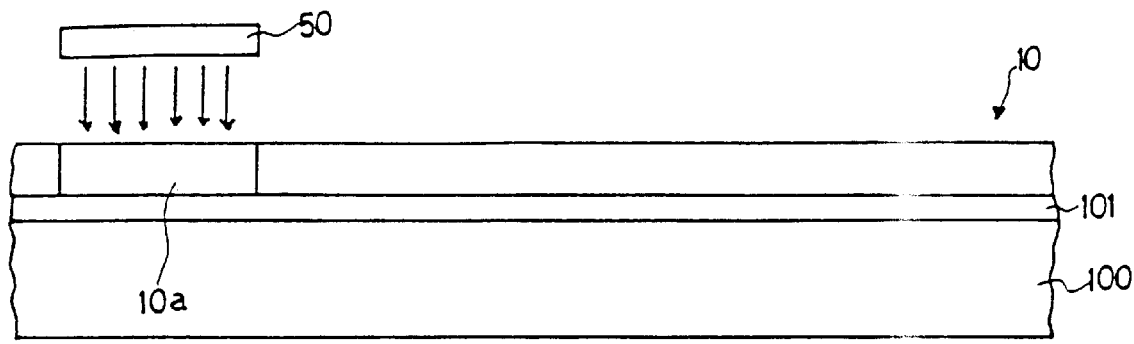
FIGS. 1A–1G illustrate a process of amorphous silicon crystallization according to conventional art.
Figure 1B:
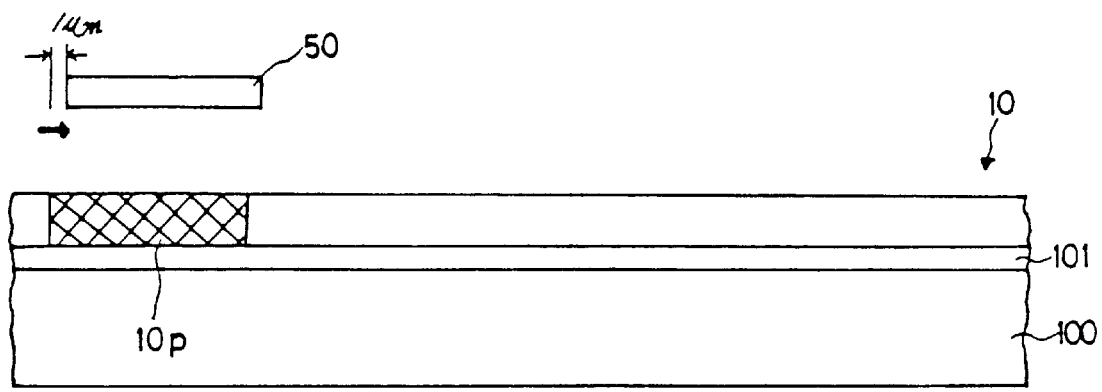
Figure 1C:
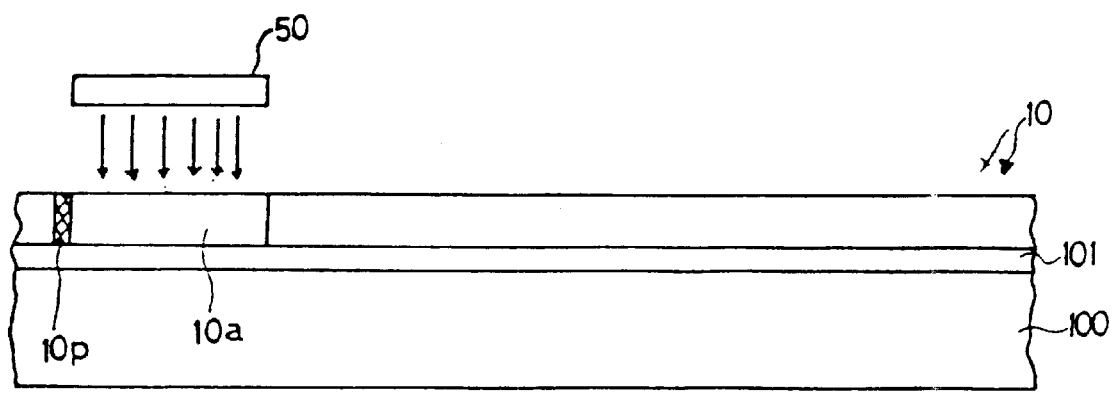
Figure 1D:
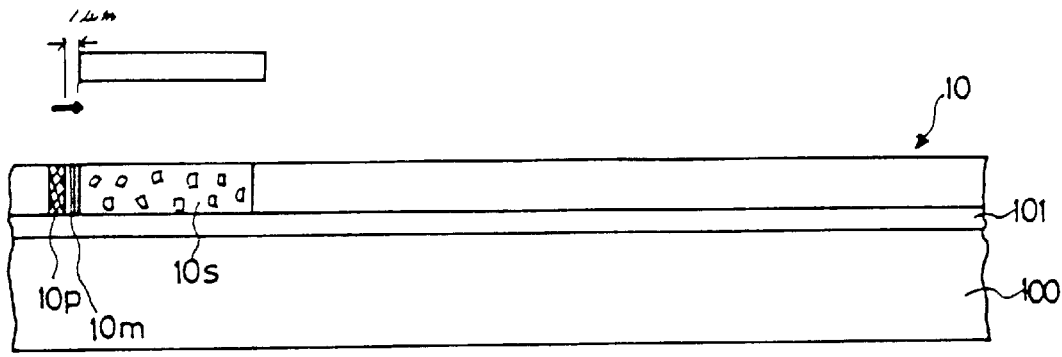
Figure 1E:
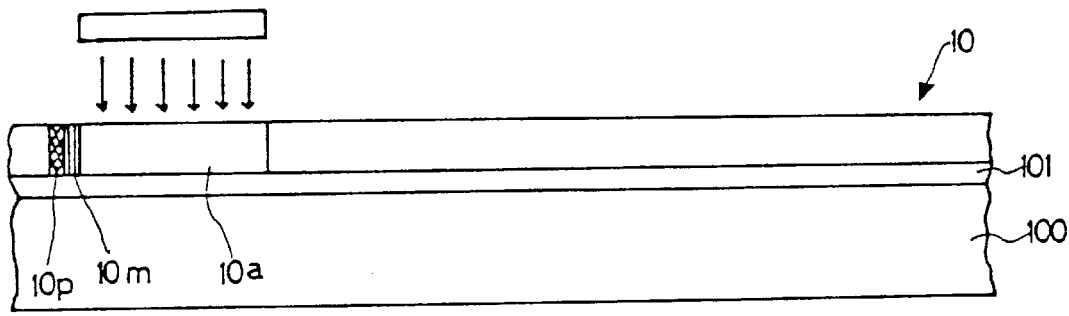
Figure 1F:
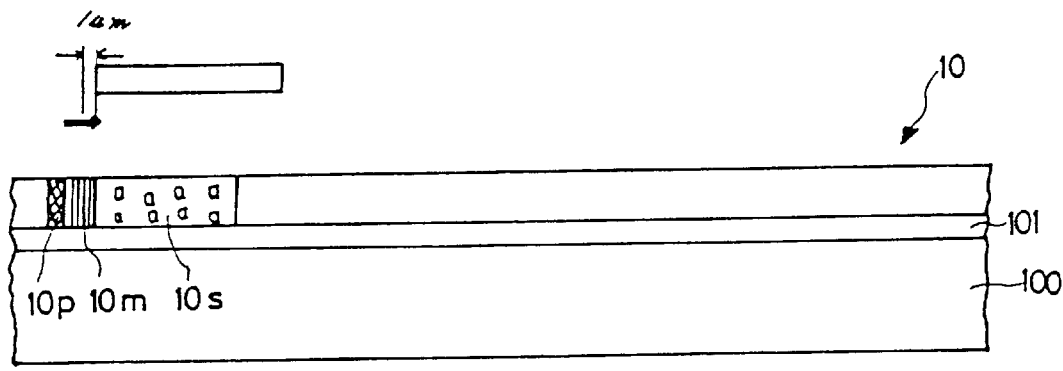
Figure 1G:
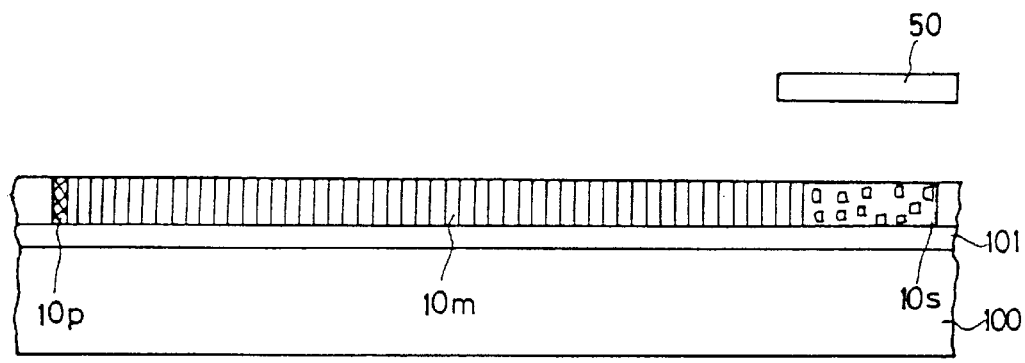
Figure 2:
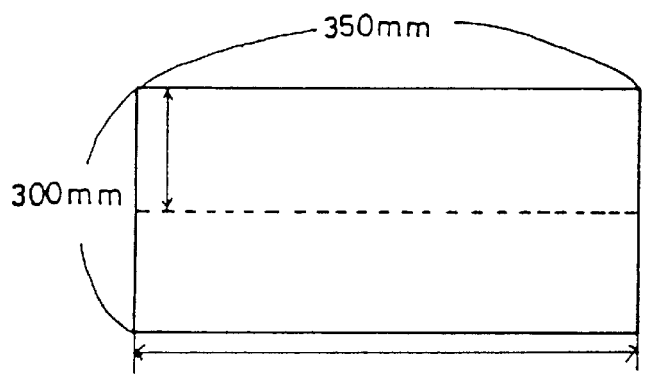
FIG. 2 illustrates the time required for amorphous silicon crystallization.
Figure 3:
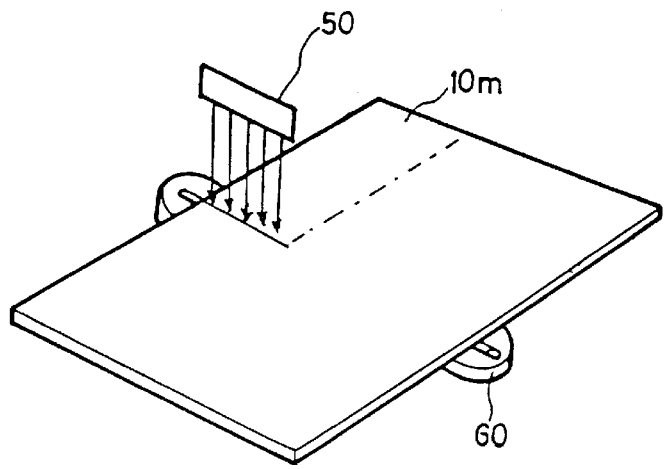
FIG. 3 is a schematic of a device for the amorphous silicon crystallization according to a preferred embodiment of the present invention.

FIG. 3 is a schematic of a device for amorphous silicon crystallization in accordance with a preferred embodiment of the present invention, having a laser beam and an RTP (Rapid Thermal Processing) for partially heating a substrate.

Referring to FIG. 3, an oxide layer functioning as a buffer layer is formed on a glass substrate, an amorphous silicon layer to be crystallized being on the oxide layer. A laser beam 50 is positioned over the amorphous silicon layer. An RTP 60 is positioned under the glass substrate and oriented parallel to the substrate and opposite to the laser beam 50. The RTP 60 moves together with the laser beam 50 scanning the substrate. The hatched part of the drawing indicates the part of the amorphous silicon layer that has a single-crystal region formed therein.

FIGS. 4A–4G illustrate a process of amorphous silicon crystallization in accordance with a preferred embodiment of the present invention, which is performed by an overlap scanning method typically using a laser.

A laser beam having a proper energy density and an appropriate repeat rate is focused on a substrate. At the same time the amorphous silicon layer is irradiated by the laser beam, the laser-irradiated portion of the substrate is partially (locally) heated up to between 700° C. and 800° C. by an RTP (Rapid Thermal Processing) device be which is positioned under the substrate opposite to the laser beam. Since lateral growth length is typically in the 4 to 5 μm range at these temperatures, the laser beam can scan the substrate in 4 μm steps, for example.

Figure 4A:
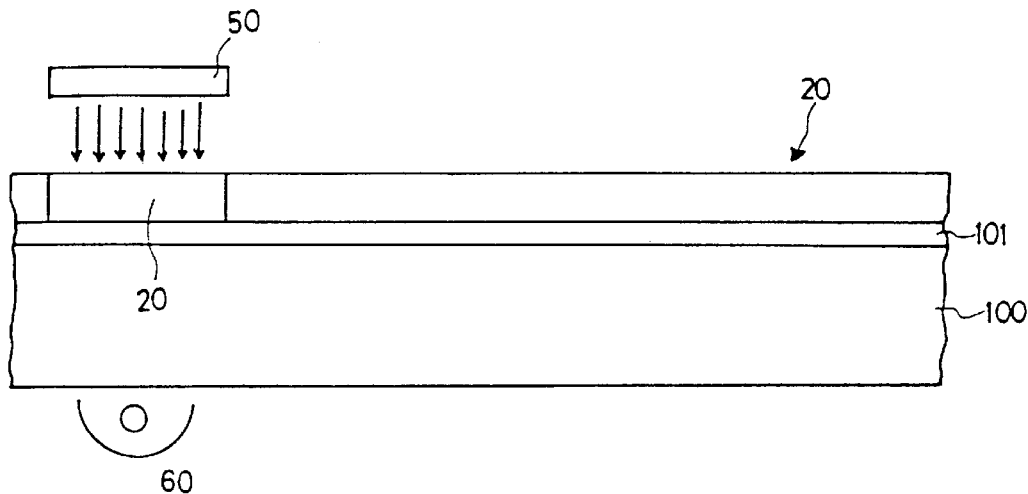
FIGS. 4A–4G illustrate a process of amorphous silicon crystallization according to a preferred embodiment of the present invention.

Referring to FIG. 4A, a silicon oxide (SiO$_2$) layer 101, functioning as a buffer layer, is formed on a glass substrate 100. The amorphous silicon layer 20, which will be crystallized, is formed on the silicon oxide layer 101. A laser beam 50 is positioned over the amorphous silicon layer 20 which is approximately several millimeters wide. The RTP device 60 is disposed under the substrate 100 opposite to the laser beam 50 in order to heat the portion of the substrate 100 irradiated by the laser beam 50.

The laser equipment is set to generate the laser beam 50 with an appropriate energy density and a repeat rate for the process. The laser beam 50 is focused on the amorphous silicon layer 20. Only the laser-irradiated portion of the substrate 100 is heated to about 700° C. to 800° C. by the RTP 60. By partially heating the substrate with the RTP device 60, crystallization can be achieved in the portion of the amorphous silicon layer 20 at these high temperature without making the entire substrate warped or bent. The portion of the amorphous silicon layer 20 irradiated by the laser beam 50 is completely melted and will be referred to as "molten region 20a".

Figure 4B:
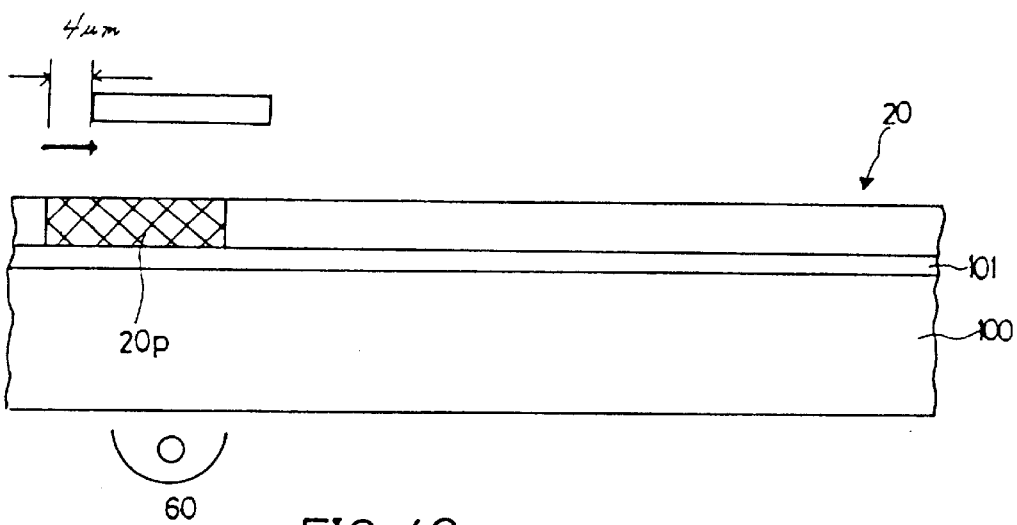

Referring to FIG. 4B, the emitting position of the laser beam 50 and the RTP device 60 are moved about 4 μm from their previous positions. Before the laser beam is emitted from the new position, the molten region 20a is cooled and solidified, producing a crystal structure transition. During the cooling and solidification, different parts of the molten region 20a produce seed crystals that will grow concurrently in different orientations. If the laser beam is approximately 1 mm wide, the amorphous silicon is crystallized to form a polycrystalline region 20p of about 1 mm wide.

Figure 4C:
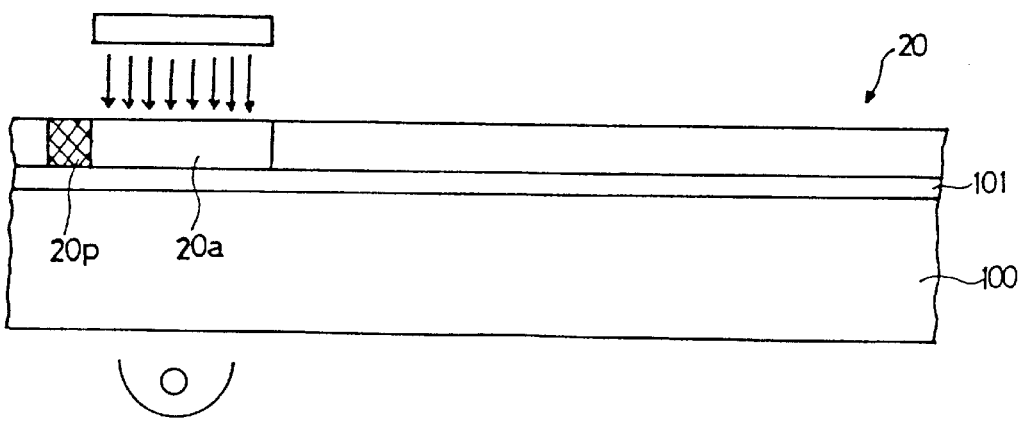

Referring to FIG. 4C, the laser beam 50 is projected onto the substrate 100, and the RTP device 60 partially (or locally) heats the laser-irradiated portion of the substrate to about 700° C. to 800° C. This portion, which includes a large portion of ployсrystalline region 20p and an amorphous silicon region of about 4 μm wide, becomes a new molten region 20a.

Figure 4D:
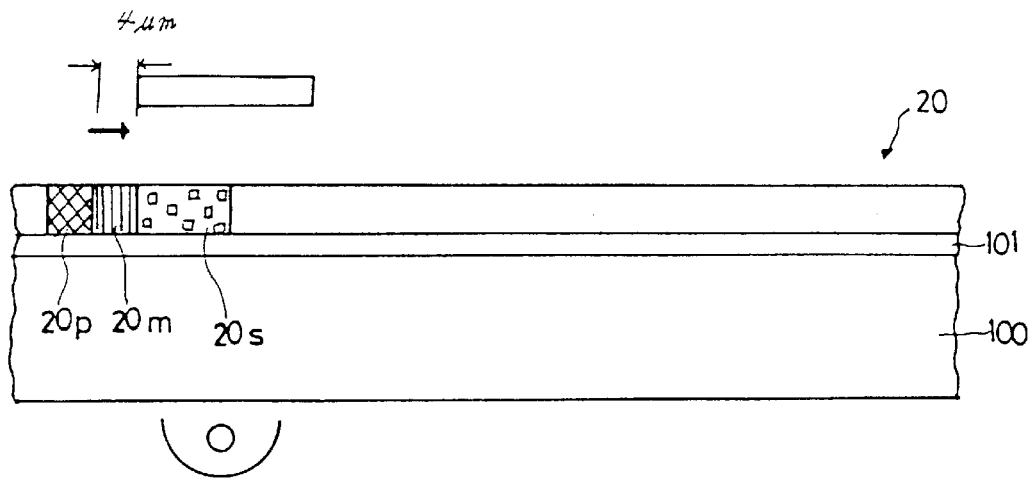

Referring to FIG. 4D, the emitting position of the laser beam 50 and the RTP device 60 are moved about 4 μm from the previous positions. As previously described with reference to FIG. 4B, before the laser beam is emitted from the new emitting position, a crystal structure transition occurs in molten region 20a that is formed in the step of FIG. 4C. The molten region 20a is cooled and solidified. During the cooling and solidification processes, the boundary of the polycrystalline region 20p that is located on the lateral wall of the molten region 20a acts as a new seed crystal to give a lateral crystal growth in the molten region 20a, forming a single-crystal region 20m. Single-crystal growth occurs for about 4 to 5 μm in width when the substrate is heated to about 700 to 800° C. by the RTP device 60, as described above. Single-crystal lateral growth on one side of the molten region 20a continues until the other part of the molten region 20a produces several seed crystals and grows to small crystals. This part of the molten region 20a will be referred to as "quasi-polycrystalline region 20s".

Figure 4E:
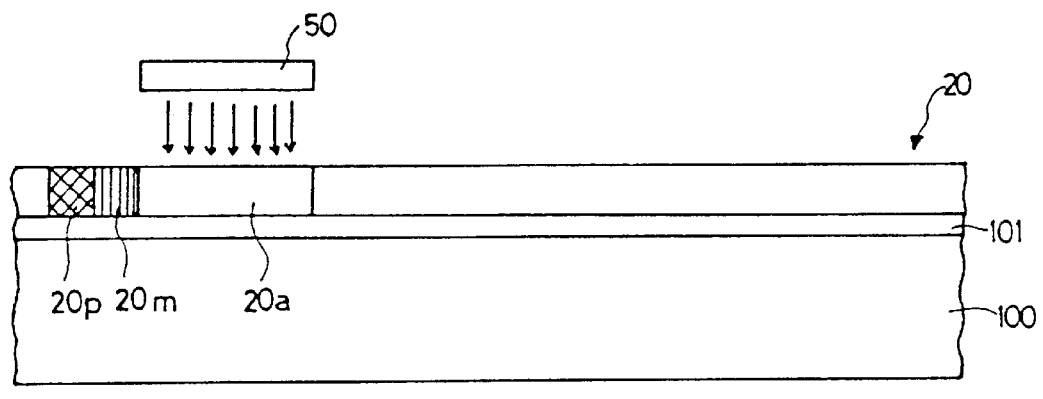

Referring to FIG. 4E, the laser beam 50 is projected onto the substrate 100 and the RTP device 60 partially heats the substrate to about 700° C. to 800° C. The laser-irradiated portion of the substrate, which includes part of the single-crystallized region 20m, quasi-polycrystalline region 20s, and an amorphous silicon region of about 4 μm wide, becomes a new molten region 20a.

Figure 4F:
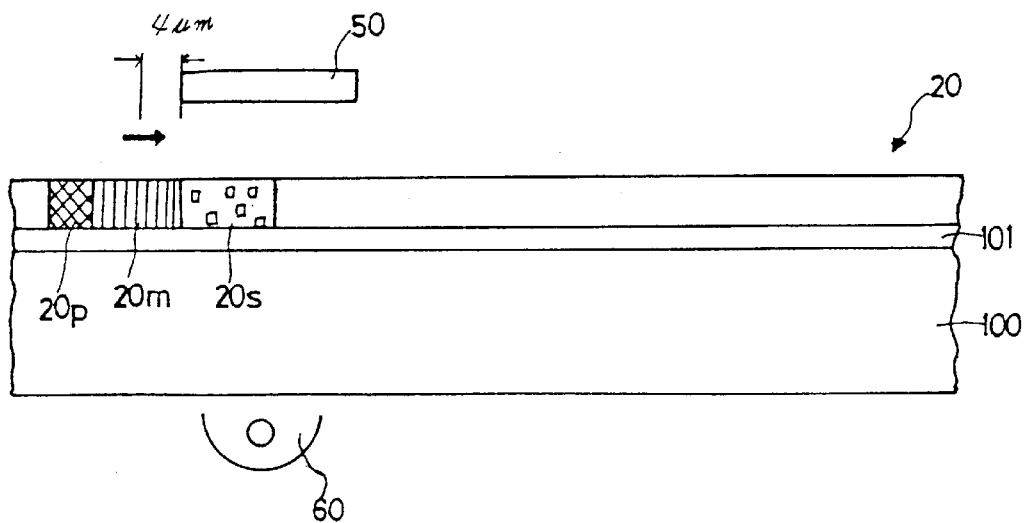
Figure 4G:
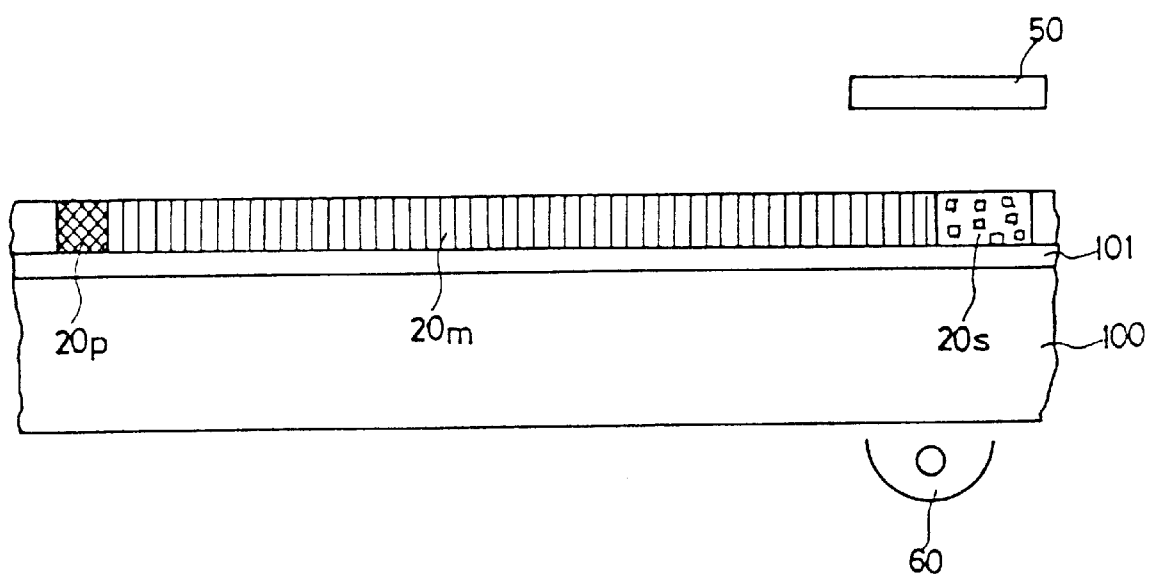

Referring to FIG. 4F, the emitting position of the laser beam 50 and the RTP device 60 are moved about 4 μm from the previous position. As previously described with reference to FIG. 4B, before the laser beam is emitted from the new emitting position, a crystal structure transition occurs in the amorphous silicon layer's molten region 20a that is formed in the step of FIG. 4E. The molten region 20a is cooled and solidified. During the cooling and solidification processes, the boundary of the single-crystal region 20m, located on the lateral wall of the molten region, acts as a new seed crystal to give a lateral growth in that molten region 20a, expanding the single-crystal region 20m. In addition, a quasi-polycrystalline region 20s is formed in the other part of the molten region 20a.

The amorphous silicon layer is melted, cooled and solidified, in a repeated manner, and the entire substrate is eventually irradiated by a laser as shown in FIG. 4a. Part of the first polycrystalline region 20p acts as a seed crystal, which has grown to the single-crystal region 20m. The quasi-polycrystalline region 20s remains at the edge of the single-crystalline region 20m. As a result, amorphous silicon on the glass substrate is grown into a single crystal layer by a single-crystallization process.

As described above, the amorphous silicon crystallization can be achieved by heating the substrate partially (locally) to about 700° C. to 800° C., making the lateral growth length for single-crystal region formation longer as compared with the conventional art. As shown in equations (1) and (2) above, the time required for crystallization achieved on a substrate can be reduced as compared with the conventional art. Additionally, the crystallization can be carried out by a laser without damaging a glass substrate with high temperatures by partially (locally) heating the laser-irradiated portion of the substage with an RTP device.

While the invention has been described in detail and with reference to specific embodiments thereof, it will be apparent to one skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A method of crystallizing an amorphous silicon layer on a substrate comprising the steps of:
    positioning a laser beam over the amorphous silicon layer on the substrate;
    irradiating a portion of the amorphous silicon layer by the laser beam; and
    heating the portion of the amorphous silicon layer from below the substrate while the portion is irradiated by the laser,
    wherein a Rapid Thermal Processing device is used to heat the portion of the amorphous silicon layer from below the substrate in the step of heating, and
    wherein the Rapid Thermal Processing device moves with the laser beam while the laser beam is irradiating the portion of the amorphous silicon layer.

2. The method according to claim 1, wherein the step of irradiating the portion of the amorphous silicon layer is performed with a repeat rate of about 300 Hz.

3. The method according to claim 1, wherein the step of irradiating the portion of the amorphous silicon layer produces a region of molten silicon.

4. The method according to claim 1, further comprising the step of moving the laser beam over the amorphous silicon layer to a position adjacent the irradiated portion of the amorphous silicon layer.

5. The method according to claim 4, wherein the step moving the laser includes moving the laser beam by about 4 μm.

6. The method according to claim 1, wherein the step of irradiating the portion of the amorphous silicon layer is performed with a repeat rate of about 300 Hz.

7. The method according to claim 1, wherein the step of irradiating the portion of the amorphous silicon layer produces a region of molten silicon.

8. The method according to claim 1, further comprising the step of moving the laser over the amorphous silicon layer to a position adjacent to the irradiated portion of the amorphous silicon layer.

9. The method according to claim 8, wherein the step of moving the laser comprises moving the laser beam by about 4 μm.

10. A method of crystallizing an amorphous silicon layer on a substrate using a pulse laser, the method comprising the steps of:
    irradiating a first predetermined area of the amorphous silicon layer on the substrate with a first laser beam pulse;
    during the step of irradiating the first predetermined area, thermally and locally annealing a portion of the amorphous silicon layer that is adjacent the first predetermined area of the amorphous silicon layer;
    irradiating a second predetermined area of the amorphous silicon layer with a second laser pulse, the second predetermined area overlapping with the first predetermined area; and
    during the step of irradiating the second predetermined area, thermally and locally annealing a portion of the amorphous silicon layer that is adjacent the second predetermined area of the amorphous silicon layer,
    wherein each of the steps of thermally and locally annealing includes the step of disposing a Rapid Thermal Processing (RTP) device below the substrate to thermally and locally anneal the respective portion of the amorphous silicon layer, and
    wherein the Rapid Thermal Processing device moves with the pulse laser while the pulse laser is irradiating the amorphous silicon layer.

11. The method according to claim 10, wherein the step of irradiating the first predetermined area includes the step of directing the first laser beam pulse toward the substrate from above the substrate, and the step of irradiating the second predetermined area includes the step of directing the second laser beam pulse toward the substrate from above the substrate.

12. The method according to claim 10, wherein each of the steps of thermally and locally annealing includes the step of thermally annealing only the portion of the amorphous silicon layer that is adjacent the respective irradiated predetermined area of the amorphous silicon layer.

13. The method according to claim 10, wherein each of the steps of thermally and locally annealing includes the step of heating the respective portion of the substrate to about 700 to 800° C.

14. The method according to claim 10, further comprising the steps of repeatedly performing the step of irradiating a predetermined area of the amorphous silicon layer and the step of thermally and locally annealing a portion of the amorphous silicon layer to process the entire amorphous silicon layer on the substrate.

15. A method of crystallizing an amorphous silicon layer on a substrate using a laser, the method comprising the steps of:
    forming a seed crystal region including a plurality of single crystal grains at one end of the amorphous silicon layer on the substrate;

irradiating a first predetermined area of the amorphous silicon layer on the substrate with a first laser beam, the first predetermined area overlapping with the seed crystal region;

during the step of irradiating the first predetermined area, thermally and locally annealing the first predetermined area of the amorphous silicon layer, a portion of the amorphous silicon layer in the first predetermined area that is adjacent the seed crystal region being grown to a substantially single-crystal layer;

irradiating a second predetermined area of the amorphous silicon layer with a second laser, the second predetermined area overlapping with the first predetermined area, a non-overlapping region of the first predetermined area being substantially coincident with the substantially single-crystal layer; and during the step of irradiating the second predetermined area, thermally and locally annealing the second predetermined area of the amorphous silicon layer, a portion of the amorphous silicon layer in the second predetermined area that is adjacent the substantially single crystal layer being transformed to single-crystal, expanding the substantially single-crystal layer to a larger substantially single-crystal layer, wherein each of the steps of thermally and locally annealing includes the step of disposing a Rapid Thermal Processing (RTP) device below the substrate to thermally and locally anneal the respective portion of the amorphous silicon layer, and wherein the Rapid Thermal Processing device moves with the first laser while the first laser is irradiating the amorphous silicon layer.

16. The method according to claim 15, further comprising the steps of:

irradiating a third predetermined area of the amorphous silicon layer with a third laser, the third predetermined area overlapping with the second predetermined area, a portion of the first predetermined area not overlapping with the third predetermined area being substantially coincident with the portion of the amorphous silicon layer in the second predetermined area that has been transformed into single-crystal; and during the step of irradiating the third predetermined area, thermally and locally annealing the third predetermined area of the amorphous silicon layer, a portion of the amorphous silicon layer in the third predetermined area that is adjacent the larger substantially single-crystal layer being transformed to single-crystal to form a still larger substantially single-crystal layer.

17. The method according to claim 15, wherein the step of forming the seed crystal region includes the steps of:

irradiating a predetermined area of the amorphous silicon layer with a laser beam;

during the step of irradiating the predetermined area, thermally and locally annealing the first predetermined area of the amorphous silicon layer.

18. The method according to claim 15, wherein each of the steps of thermally and locally annealing includes the step of heating the respective portion of the substrate to about 700 to 800° C. to transform the respective portion of the amorphous silicon layer into a single-crystal layer of about 4 $\mu$m in length.

19. A method of crystallizing an amorphous silicon layer on a substrate using a laser, the method comprising the steps of:

positioning an emitting position of the laser over the amorphous silicon layer on the substrate;

irradiating a first laser beam from the emitting portion;

irradiating a first predetermined area of the amorphous silicon layer on the substrate with a first laser beam pulse;

during the step of irradiating the first predetermined area, thermally and locally annealing a portion of the amorphous silicon layer that is adjacent the first predetermined area of the amorphous silicon layer;

irradiating a second predetermined area of the amorphous silicon layer with a second laser pulse, the second predetermined area overlapping with the first predetermined area; and during the step of irradiating the second predetermined area, thermally and locally annealing a portion of the amorphous silicon layer that is adjacent the second predetermined area of the amorphous silicon layer, wherein each of the steps of thermally and locally annealing includes the step of disposing a Rapid Thermal Processing (RTP) device below the substrate to thermally and locally anneal the respective portion of the amorphous silicon layer, and wherein the Rapid Thermal Processing device moves with the first laser while the first laser is irradiating the amorphous silicon layer.

* * * * *